United States Patent
Gersdorff et al.

(10) Patent No.: US 10,472,718 B2
(45) Date of Patent: Nov. 12, 2019

(54) TEMPERATURE-CONTROLLED GAS SUPPLY LINE WITH DILUTION GAS FLOWS SUPPLIED AT MULTIPLE LOCATIONS

(71) Applicant: AIXTRON SE, Herzogenrath (DE)

(72) Inventors: Markus Gersdorff, Herzogenrath (DE); Martin Dauelsberg, Aachen (DE); Baskar Pagadala Gopi, Aachen (DE); Michael Long, Herzogenrath (DE)

(73) Assignee: AIXTRON SE, Herzogenrath (DE)

( * ) Notice: Subject to any disclaimer, the term of this patent is extended or adjusted under 35 U.S.C. 154(b) by 381 days.

(21) Appl. No.: 15/517,461

(22) PCT Filed: Oct. 1, 2015

(86) PCT No.: PCT/EP2015/072669
§ 371 (c)(1),
(2) Date: Apr. 6, 2017

(87) PCT Pub. No.: WO2016/062514
PCT Pub. Date: Apr. 28, 2016

(65) Prior Publication Data
US 2018/0265984 A1    Sep. 20, 2018

(30) Foreign Application Priority Data

Oct. 24, 2014 (DE) .......................... 10 2014 115 497

(51) Int. Cl.
*C23C 16/455* (2006.01)
*C23C 16/52* (2006.01)
(Continued)

(52) U.S. Cl.
CPC ........ *C23C 16/45561* (2013.01); *C23C 14/12* (2013.01); *C23C 14/228* (2013.01);
(Continued)

(58) Field of Classification Search
CPC . C23C 16/45561; C23C 16/52; C23C 14/228; C23C 14/541; C23C 16/4481; C23C 14/243; C23C 14/12
See application file for complete search history.

(56) References Cited

U.S. PATENT DOCUMENTS 5,190,913 A * 3/1993 Higashiyama ........ C23C 16/408
                                                  118/688
5,776,254 A * 7/1998 Yuuki .................. C23C 16/409
                                                  118/725
(Continued)

FOREIGN PATENT DOCUMENTS

DE     10212923 A1    1/2004
EP     0849375 A2     6/1998
(Continued)

OTHER PUBLICATIONS

International Search Report dated Feb. 5, 2016, by the European Patent Office, for International Patent Application No. PCT/EP2015/072669 (filed Oct. 1, 2015), 7 pages including English translation.

(Continued)

*Primary Examiner* — Jeffrie R Lund
(74) *Attorney, Agent, or Firm* — Ascenda Law Group, PC

(57) ABSTRACT

A device and a method for depositing organic layers onto a substrate includes a process gas source with a temperature-controlled evaporator, and a carrier gas supply line which opens into the evaporator in order to supply a carrier gas flow into a temperature-controlled first transport line. A first dilution gas supply line, which opens into the first transport line, supplies a dilution gas flow into the first transport line. The device also comprises a temperature-controlled gas inlet element fluidly connected to the first transport line. A gaseous starting material can be supplied into a processing chamber via the gas inlet element. A substrate is disposed on (Continued)

a temperature-controlled susceptor located in the processing chamber, and a layer is grown on the substrate using the gaseous starting material.

11 Claims, 2 Drawing Sheets

(51) Int. Cl.
  *C23C 14/22* (2006.01)
  *C23C 14/54* (2006.01)
  *C23C 16/448* (2006.01)
  *C23C 14/24* (2006.01)
  *C23C 14/12* (2006.01)

(52) U.S. Cl.
  CPC .......... *C23C 14/243* (2013.01); *C23C 14/541* (2013.01); *C23C 16/4481* (2013.01); *C23C 16/52* (2013.01)

(56) References Cited

U.S. PATENT DOCUMENTS

| | | |
|---|---|---|
| 2003/0054099 A1 | 3/2003 | Jurgensen et al. |
| 2003/0056720 A1* | 3/2003 | Dauelsberg ....... C23C 16/45514 117/200 |
| 2008/0241381 A1 | 10/2008 | Suzuki |
| 2009/0087545 A1 | 4/2009 | Ohmi et al. |
| 2010/0092665 A1 | 4/2010 | Sudou |
| 2011/0081504 A1* | 4/2011 | Gersdorff ................. B05D 1/60 427/585 |
| 2011/0293832 A1* | 12/2011 | Gersdorff ................. B05D 1/60 427/255.28 |
| 2015/0240355 A1* | 8/2015 | Nasman .................. C23C 16/52 239/136 |
| 2017/0159175 A1* | 6/2017 | Yagi ..................... C23C 16/4481 |
| 2017/0283949 A1* | 10/2017 | Yahata .................... C23C 16/46 |
| 2018/0265984 A1* | 9/2018 | Gersdorff .............. C23C 14/228 |

FOREIGN PATENT DOCUMENTS

| | | |
|---|---|---|
| WO | 01/61071 A2 | 8/2001 |
| WO | 2012/175128 A1 | 12/2012 |

OTHER PUBLICATIONS

Written Opinion of the International Searching Authority dated Feb. 5, 2016, by the European Patent Office, for International Patent Application No. PCT/EP2015/072669 (filed Oct. 1, 2015), 7 pages.

* cited by examiner

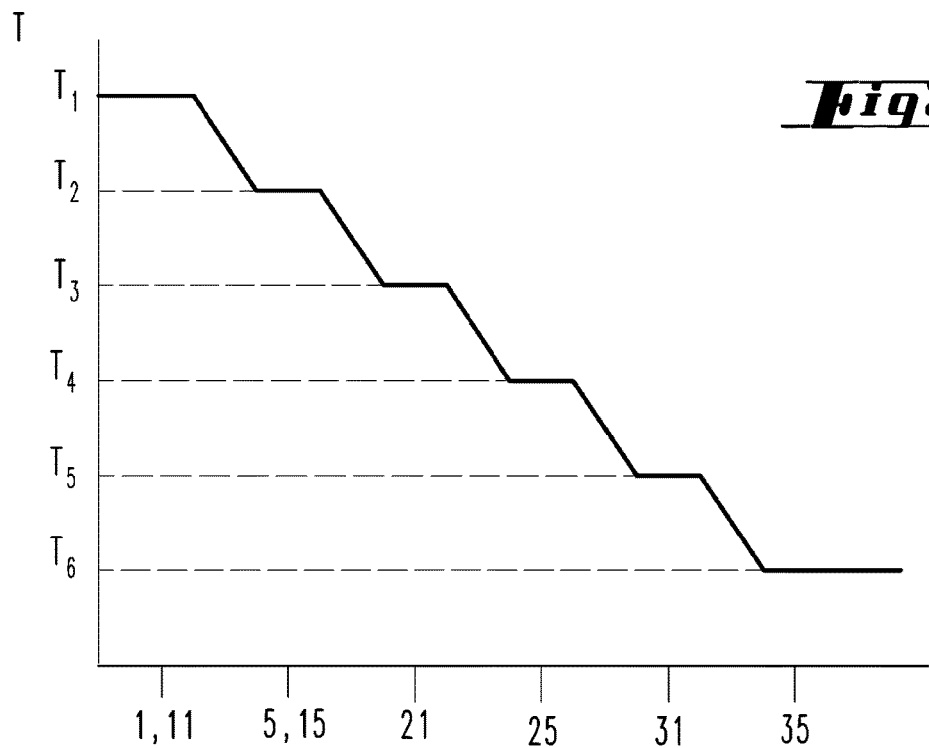
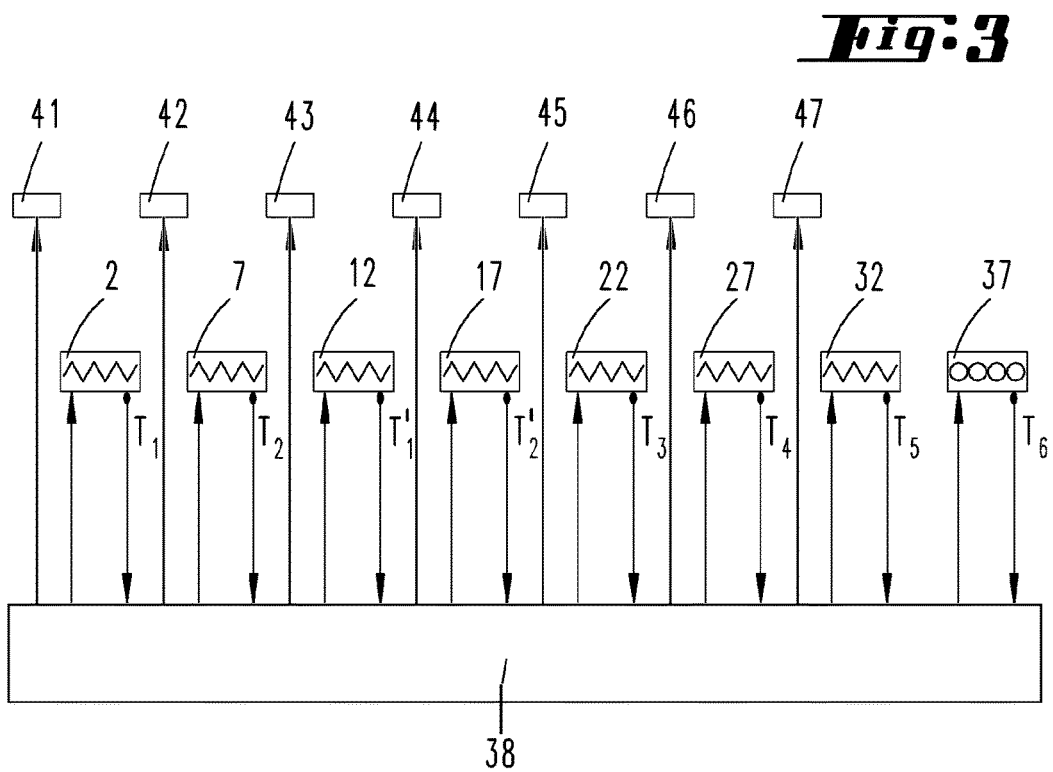

TEMPERATURE-CONTROLLED GAS SUPPLY LINE WITH DILUTION GAS FLOWS SUPPLIED AT MULTIPLE LOCATIONS

RELATED APPLICATIONS

This application is a National Stage under 35 USC 371 of and claims priority to International Application No. PCT/EP2015/072669, filed 1 Oct. 2015, which claims the priority benefit of DE Application No. 10 2014 115 497.5, filed 24 Oct. 2014.

FIELD OF THE INVENTION

The invention relates to a device and a method for depositing one or more in particular organic layers onto a substrate, with a process gas source exhibiting an evaporator, wherein a solid or liquid starting material can be evaporated into a gaseous starting material in the evaporator by supplying heat generated by a source temperature-controlling device at a source temperature, wherein a carrier gas supply line opens into the evaporator in order to feed a carrier gas flow for transporting the gaseous starting material out of the evaporator into a first transport line, wherein the first transport line can be temperature-controlled to a line temperature by means of a line temperature-controlling device, and a first dilution gas supply line opens into the first transport line in order to feed a dilution gas flow into the first transport line, wherein the first dilution gas supply line is located upstream from the line temperature-controlling device, and with a gas inlet element that can be temperature-controlled to a gas inlet temperature by means of a gas inlet temperature-controlling device, and is fluidically connected to the first transport line, wherein another dilution gas supply line opens into the gas inlet element upstream from the gas inlet temperature-controlling device in order to feed a dilution gas flow into the gas inlet element, by means of which the gaseous starting material can be supplied into a processing chamber, which exhibits a susceptor that can be temperature-controlled to a susceptor temperature by means of a susceptor temperature-controlling device, such that a layer is grown on the substrate lying on the susceptor by means of the gaseous starting material, and a controlling device, which is set up so as to temperature-control the temperature of the source temperature-controlling device to the source temperature, the line temperature-controlling device to the line temperature, the gas inlet temperature-controlling device to the gas inlet temperature, and the susceptor temperature-controlling device to the susceptor temperature.

BACKGROUND

Known from US 2008/0241381 A1 is a device for depositing metals, in which metal carbonyls are heated to an evaporation temperature in a source. A carrier gas is used to supply the metal carbonyls through a heated gas line into a gas inlet element of a processing chamber, into which a dilution gas is additionally supplied. A metal is to be deposited onto a substrate whose temperature is higher than the source temperature via the thermal decomposition of the metal carbonyls.

WO 01/61071 A2 describes a device and a method for condensation coating. Liquid starting materials stored in a storage tank are evaporated by supplying heat. In gas lines warmer than the sources, the vapor is routed to a gas inlet element, from which the starting materials flow into a processing chamber that holds a substrate onto which the starting material is to be deposited.

EP 0 849 375 A2 describes a method and a device for evaporating a liquid starting material. The latter is conveyed by a pump out of a storage tank and then evaporated by supplying heat.

A device for evaporating a solid starting material is described in WO 2012/175128. It involves an organic starting material that is stored in a heatable processing gas source in a porous reservoir. A carrier gas flow is passed through the porous reservoir. The reservoir is heated so as to evaporate the solid starting material. The resultant gaseous starting material is introduced into a processing chamber of a reactor, which exhibits a susceptor bearing a substrate onto which the gaseous starting material condenses.

DE 10 212 923 A1 describes a method for coating a substrate and an accompanying device, wherein processing gas sources are provided which each exhibit a container that contains a respective powdery starting material. Heat is passed through to convert the powdery starting material into a gaseous starting material, which is transported into a processing chamber by a carrier gas.

WO 01/61071 A2 describes a condensation coating method which provides a processing gas source that delivers a gaseous starting material by supplying heat, which is transported to a gas inlet element of a reactor by a carrier gas. This takes place with a transport line into which a dilution gas line opens.

SUMMARY OF THE INVENTION

In a generic method or a generic device, a processing gas source is used to provide a gaseous starting material, whose condensation temperature is distinctly higher than room temperature. As a result, not just the entire transport line must be heated from the evaporator to the gas inlet element. The gas inlet element must also be heated in such a way that no condensation of the starting material takes place in the gas inlet element. The gas inlet element comprises the cover of a processing chamber. It has a gas outlet area with a plurality of gas outlet openings, through which the process gas transported by the carrier gas flows into the processing chamber. Located only a slight distance below the outlet surface is the upper side of the susceptor, on which rest one or several substrates. A layer from the evaporated organic material is to be deposited onto the upper sides of the substrate. This is accomplished through condensation. As a consequence, the surface of the substrate must lie at a relatively low temperature. To this end, the susceptor upon which rest the substrates is actively cooled. The gas outlet surface supplies heat via thermal radiation, but also via thermal conduction of the substrate surface. This heat must be must be transferred from the substrate surface to the cooling device of the susceptor by maintaining a temperature gradient. This can only be done through exposure to an external power.

The object of the invention is to indicate measures with which the cooling power of the susceptor cooler can be diminished.

The object is achieved by the invention indicated in the claims, wherein each claim represents an independent solution to the object.

The first dilution gas line is situated upstream from the line temperature-controlling device. Another dilution gas line further empties into the gas inlet element upstream from the gas inlet temperature-controlling device. The dilution gas supply lines feed inert gas flows into the line connection between the process gas source and gas inlet element. The dilution gas preferably involves the same gas that also forms the carrier gas, e.g., an inert gas such as argon, nitrogen or hydrogen. As a consequence, the gaseous starting material goes through at least two dilution stages while being transported from the evaporator to the gas inlet element. A continuous or incremental dilution establishes the precondition that the line temperature of the gas transport line from the evaporator to the gas inlet element can be lowered incrementally or even continually. Therefore, it is provided that the source temperature be higher than the line temperature, that the line temperature in turn be higher than the gas inlet temperature, and that the gas inlet temperature in turn be higher than the susceptor temperature.

The device according to the invention has a controlling device, which can be used to regulate the source temperature-controlling device to the source temperature, the line temperature-controlling device to the line temperature, the gas inlet temperature-controlling device to the gas inlet temperature and the susceptor temperature-controlling device to the susceptor temperature. As a result of this device configuration or method implementation, the temperature difference between the gas outlet surface of the gas inlet element and the upper side of the substrates facing the gas outlet surface is lower than in prior art. Because of this, less heat is transported from the gas inlet element to the susceptor. The cooling power of the susceptor is lower. As a further consequence, a vertical temperature gradient within the substrate is lower than in prior art. A further development of the invention provides that two or more process gas sources are provided. Each of the two or more process gas sources has an evaporator, in which a solid or liquid starting material is evaporated into a gaseous starting material by supplying heat. To this end, heat is supplied to the evaporator. Each evaporator has a source temperature-controlling device for generating the evaporation heat. Each of the sources is kept at a source temperature. The two source temperatures can differ from each other. In like manner, the starting materials can differ from each other. The two or more evaporators are each connected with a mixer by transport lines. Each of the transport lines has a line temperature-controlling device, which can be temperature-controlled to a line temperature. A dilution gas flow is supplied to the line temperature-controlling device upstream in each transport line. These gas mixtures are fed into a mixing device. The mixing device has a mixer heating device, which is used to adjust the temperature of the mixing device to a mixer temperature. The mixer temperature is lower than each of the line temperatures. However, the mixer temperature is higher than the gas inlet temperature. A further development of the invention provides that the mixing device be fluidically connected with the gas inlet element by another, in particular a third transport line. Upstream from the third line temperature-controlling device, another dilution gas supply line opens into the third transport line, through which a dilution gas flow is fed into the transport line. The third line temperature lies between the mixer temperature and the gas inlet temperature. By implementing the method according to the invention in a device according to the invention, the temperature of the continually or incrementally diluted process gas flow is continually or incrementally lowered from the evaporator to the gas outlet surface of the gas inlet element. This is possible because the partial pressure of the gaseous starting material in the gas flow is incrementally or continually lowered as a result of the dilution. Nonetheless, the temperature of the gas flow lies above the condensation point of the gaseous starting material at each location of the gas line system between the evaporator and gas outlet opening of the gas inlet element.

BRIEF DESCRIPTION OF THE DRAWINGS

An exemplary embodiment of the invention will be explained below based on the attached drawings. Shown on:

FIG. 2 is a schematic view of the temperature progression within the gas line system from the source 1 to the susceptor 35, and FIG. 3 is a schematic view of the control system of the device.

DETAILED DESCRIPTION

Figure 1:
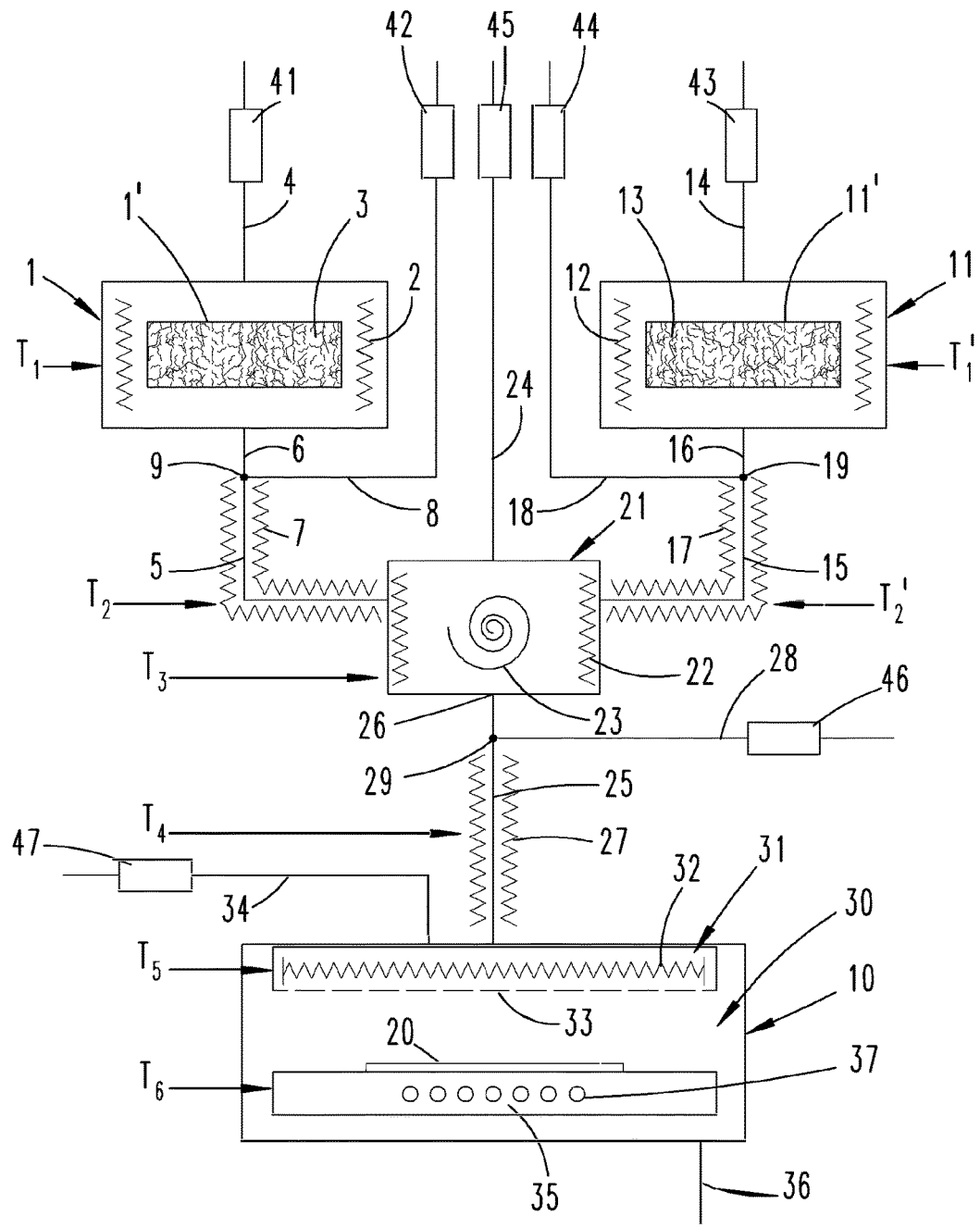
FIG. 1 is a schematic illustration of a device according to the invention.

The device illustrated only schematically on FIG. 1 has a reactor 10, which is a housing having an outwardly gastight seal. The housing can be evacuated by means of a discharge line 36, which is hooked up to a pump. Situated within the reactor 10 is a susceptor 35 consisting of metal, which incorporates cooling channels 37 that can be used to adjust the temperature of the upper side of the susceptor 35 designed as a cooling block to a susceptor temperature $T_6$ of −50 to 10° C. The upper side of the susceptor 35 forms the floor of the processing chamber 30, upon which are situated one or more substrates 20. The ceiling of the processing chamber 30 is comprised of a gas outlet surface of a gas inlet element 31. The gas outlet surface of the gas inlet element 31 has a plurality of sieve-like gas outlet openings 33 distributed uniformly over the entire gas outlet surface, from which a process gas can flow into the processing chamber 30. The gas inlet element 31 can be designed as a showerhead.

The process gas contains a gaseous starting material, which is fed into the processing chamber 30. The temperature of the surface of the substrate 20 is lower than the condensation temperature of the gaseous starting material, so that the gaseous starting material condenses on the upper side of the substrate 20 as a layer.

Provided within the gas inlet element 31 is a temperature-controlling device 32. This temperature-controlling device 32 is designed as a heater in the exemplary embodiment, and used to adjust the temperature of the gaseous starting material to the temperature $T_5$ (gas inlet temperature).

The device has at least one source 1, in which a solid or liquid starting material 3 is held available. The starting material 3 is kept at a source temperature $T_1$, which is higher than the gas inlet temperature $T_5$. The starting material 3 can be stored as a porous body, a powder or the like. However, the starting material can also be coated onto a porous body. A source temperature-controlling device 2 is provided that takes the form of a heater. The heater continually feeds heat into an evaporator 1', which contains the starting material 3, so that the starting material 3 is converted into gaseous form. However, a liquid starting material can also be used in place of a solid starting material.

A carrier gas supply line 4 opens into the evaporator 1'. A mass flow controller 41 is used to feed a carrier gas flow into the evaporator 1'. Involved here is argon, nitrogen, hydrogen or another inert gas. The starting material 3 converted into gaseous form is transported from the evaporator 1' through a gas outlet 6. The gas outlet 6 is connected with a transport line 5, so that the gaseous starting material can be fed out of the gas outlet 6 and into the transport line 5. Immediately downstream from the gas outlet 6, a dilution gas supply line 8 opens into the adjoining transport line 5. A dilution gas is fed into the gas line through the dilution gas supply line 8. The mass flow of the gas fed into the carrier gas supply line and the mass flow of the gas fed into the dilution gas line is regulated by a mass flow controller 41, 42, respectively. The carrier gas flow that transports the gaseous starting material is thereby mixed with the dilution gas flow at the feed-in point 9, wherein the dilution gas is the same gas also comprising the carrier gas flow.

The transport line 5 adjoining the feed-in point 9 is heated by a heating device 7. This line temperature-controlling device is designed as a heating sleeve. It heats the transport line 5 to a transport line temperature $T_2$ that is lower than the source temperature $T_1$.

Provided in the exemplary embodiment is a second process gas source 11, which exhibits a second evaporator 11' that is also provided with a heating device 12, with which a liquid or solid starting material 13 is adjusted to a second source temperature $T_1'$. Here as well, a supply line 14 opens into the evaporator 11', and carries a carrier gas flow controlled by means of a mass flowmeter 43, feeding it into the evaporator 11'. The carrier gas transports the evaporated starting material out of the evaporator 11' through a gas outlet 16.

A dilution gas is fed into the gas flow at a feed-in point 19. This takes place by means of a dilution gas supply line 18, through which a mass flow of a dilution gas controlled by a mass flow controller 44 is supplied.

Extending downstream from the feed-in point 19 is a transport line 15, which is enveloped by a heating sleeve that comprises a line heater 17, with which the transport line 15 is kept at a line temperature $T_2'$. The line temperature $T_2'$ is lower than the source temperature $T_1'$. The starting material 13 consists of various organic materials.

The transport line 5 and transport line 15 open into a mixing device 21, which incorporates gas deflection elements 23 used to mix together the gas mixtures entering into the mixing device 21 from the transport lines 5, 15.

Provided inside of the mixing device 21 is a mixing temperature-controlling device 22. Involved here is a heating device, with which the mixing device 21 and in particular the gas deflection elements 23 are kept at a mixer temperature $T_3$. The mixer temperature $T_3$ is lower than the line temperatures $T_2$, $T_2'$. In order to prevent the gaseous starting material from condensing on the gas deflection surfaces 23, the gas mixture comprised of carrier gas and gaseous starting material that enters into the mixing device 21 is diluted further. To this end, another dilution gas supply line 24 opens into the mixing chamber of the mixer 21 upstream from the gas deflection elements 23 and in particular upstream from the heating device 22. The dilution gas flow fed into the mixing chamber through the dilution gas supply line 24 is controlled by a mass flow controller 45.

The gas mixture mixed in the mixing device 21 exits the mixing device 21 through a gas outlet 26. Located there is another feed-in point 29, at which another dilution gas supply line 28 opens into the gas flow. Another dilution gas flow controlled by a mass flow regulator 46 is fed into the gas flow through the dilution gas supply line 28. The feed-in point 29 is located immediately downstream from the gas outlet 26.

The transport line 25 extending downstream from the feed-in point 29 is heated by a heating sleeve 27 to a line temperature $T_4$ that is lower than the mixer temperature $T_3$ and higher than the temperature $T_5$ inside of the gas inlet element 31.

The transport line 25 opens into the gas inlet element 31, in which a heating device 32 is located. Upstream from the heating device 32, a dilution gas supply line 34 opens into the gas inlet element 31, through which another dilution gas flow controlled by a mass flow regulator 47 is fed into the gas inlet element 31. The gas flow fed into the gas inlet element 31 is thereby diluted further upstream from the heating device 32.

The incremental dilution of the gaseous starting material in the gas line between the source 1, 11 or evaporator 1', 11' and gas inlet element 31 leads to an incremental reduction in the partial pressure of the gaseous starting material or gaseous starting material inside of the gas line system in the direction of flow. This enables the temperature progression described above in the gas transport system as illustrated on FIG. 2, which shows that the temperature between the source 1, 11 or evaporator 1', evaporator 11' and susceptor 35 incrementally decreases, wherein the temperature progression is only qualitatively depicted on FIG. 2. The temperature difference between the temperatures $T_5$ and $T_6$ can be higher than the remaining temperature steps.

FIG. 3 illustrates the controller. The system has a controlling device 38, which can be used to adjust the temperatures $T_1, T_2, T_1', T_2', T_3, T_4, T_5$ and $T_6$. This takes place by means of regulators and control elements that supply heating power to the heating devices 2, 7, 12, 17, 22, 27, 32. The temperatures $T_1, T_2, T_1', T_2', T_3, T_4, T_5$ and $T_6$ are measured by means of thermocouples, and made available to the controlling device 38 for regulation purposes. The controlling device supplies the cooling device 37 with cooling power. The controlling device is further able to actuate the mass flow controllers 41-47, which are used to regulate the carrier gas flows or dilution gas flows.

The above statements serve to explain the inventions encompassed by the application as a whole, which each separately further develop the prior art at least through the following feature combinations:

A device, characterized in that the first dilution gas supply line 8, 18 is situated upstream from the line temperature-controlling device 7, 17, and another dilution gas supply line 34 opens into the gas inlet element 31 upstream from the gas inlet temperature-controlling device 32, so as to feed a dilution gas flow into the gas inlet element 31.

A device, characterized by a controlling device set up so as to be able to adjust the source temperature-controlling device 2, 12 to the source temperature $T_1, T_1'$, the line temperature-controlling device 7, 17 to the line temperature, $T_2, T_2'$, the gas inlet temperature-controlling device 32 to the gas inlet temperature $T_5$, and the susceptor temperature-controlling device 37 to the susceptor temperature $T_6$.

A method, characterized in that the first dilution gas supply line 8, 18 is situated upstream from the line temperature-controlling device 7, 17, and that a dilution gas flow is fed into the gas inlet element 31 through another dilution gas supply line 34, which opens into the gas inlet element 31 upstream from the gas inlet temperature-controlling device 32.

A device, characterized in that the first source temperature $T_1, T_1'$ is higher than the line temperature $T_2, T_2'$, the line temperature $T_2, T_2'$ is higher than the gas inlet temperature $T_5$, and the gas inlet temperature $T_5$ is higher than the one susceptor temperature $T_6$.

A device, characterized by a process gas source that exhibits a second evaporator 11', wherein a solid or liquid second starting material can be evaporated into a second gaseous starting material at a second source temperature $T_1'$ in the second evaporator 11' by supplying heat generated by a second source temperature-controlling device 12, wherein a second carrier gas supply line 14 opens into the second evaporator 11' for supplying a second carrier gas flow to transport the second gaseous starting material out of the second evaporator 11' and into a second transport line 15, wherein the second transport line 15 is temperature-controlled to a second line temperature $T_2'$ by a second line temperature-controlling device 17, and a second dilution gas supply line 18 opens into the second transport line 15, through which a second dilution gas flow is fed into the second transport line 18, wherein the first transport line 8 and second transport line 18 open into a mixer 21, which is temperature-controlled to a mixer temperature $T_3$ by a mixer temperature-controlling device 22, wherein a dilution gas supply line 24 opens into the mixing device 21 upstream from the mixer temperature-controlling device 22, and is used to feed a dilution gas flow into the mixing device 21.

A method, characterized by a process gas source that exhibits a second evaporator 11', wherein a solid or liquid second starting material is evaporated into a second gaseous starting material at a second source temperature $T_1'$ in the second evaporator 11' by supplying heat generated by a second source temperature-controlling device 12, wherein a second carrier gas supply line 14 opens into the second evaporator 11', into which is fed a second carrier gas flow that transports the second gaseous starting material out of the second evaporator 11' and into a second transport linen 15, wherein the second transport line 15 is temperature-controlled to a second line temperature $T_2'$ by a second line temperature-controlling device 17, and a second dilution gas supply line 18 opens into the second transport line 15, through which a second dilution gas flow is fed into the second transport line 18, wherein the first transport line 8 and second transport line 18 open into a mixer 21, which is temperature-controlled to a mixer temperature $T_3$ by a mixer temperature-controlling device 22, wherein a dilution gas supply line 24 opens into the mixing device 21 upstream from the mixer temperature-controlling device 22, and is used to feed a dilution gas flow into the mixing device 21.

A device, characterized in that the mixer temperature $T_3$ is lower than the first and second line temperature $T_2$, $T_2'$, and higher than the gas inlet temperature $T_5$.

A device, characterized by a transport line 25 situated downstream from the mixing device 21 and upstream from the gas inlet element 31 for transporting the gaseous starting material from the mixing device 21 into the gas inlet element 31, which can be temperature-controlled to a line temperature $T_4$ by a line temperature-controlling device 27, wherein a dilution gas supply line 28 opens into the transport line 25 upstream from the line temperature-controlling device 27 to feed a dilution gas flow into the transport line 25.

A method, characterized by a transport line 25 situated downstream from the mixing device 21 and upstream from the gas inlet element 31 through which the gaseous starting material is transported from the mixing device 21 into the gas inlet element 31, which is temperature-controlled to a line temperature $T_4$ by a line temperature-controlling device 27, wherein a dilution gas supply line 28 opens into the transport line 25 upstream from the line temperature-controlling device 27, with which the a dilution gas flow is fed into the transport line 25.

A device, characterized in that the mixer temperature $T_3$ is higher than the line temperature $T_4$, and the line temperature $T_4$ is higher than the gas inlet temperature $T_5$.

A method, characterized in that the partial pressure of the gaseous starting material in the carrier gas flow is incrementally diminished by feeding a plurality of dilution gas flows into a heated line connection between the evaporator 1', 11' and gas inlet element 31 at different points spaced apart from each other in the direction of flow, wherein the line connection is heated in such a way that the temperature in the gas flow is higher than the condensation temperature of the gaseous starting material at each point on the line connection.

All disclosed features are essential to the invention (taken individually, but also in combination with each other). The disclosure of the application hereby also incorporates the disclosure content of the accompanying/attached priority documents (copy of prior application) in its entirety, also for the purpose of including features in these documents in claims of the present application. The features in the sub-claims characterize independent inventive further developments of prior art, in particular with the aim of implementing partial applications based upon these claims.

REFERENCE LIST

| | | |
|---|---|---|
| 1 | Process gas source | |
| 1' | Evaporator | |
| 2 | Heating device $T_1$ | |
| 3 | Starting material | |
| 4 | Supply line 1 | |
| 5 | Transport line | |
| 6 | Gas outlet | |
| 7 | Heating device $T_2$ | |
| 8 | Supply line | |
| 9 | Feed-in point | |
| 10 | CVD reactor | |
| 11 | Process gas source | |
| 11' | Evaporator | |
| 12 | Heating device $T_1'$ | |
| 13 | Starting material | |
| 14 | Supply line | |
| 15 | Transport line | |
| 16 | Gas outlet | |
| 17 | Heating device $T_2'$ | |
| 18 | Supply line | |
| 19 | Feed-in point | |
| 20 | Substrate | |
| 21 | Mixing device | |
| 22 | Heating device $T_3$ | |
| 23 | Gas deflection element | |
| 24 | Supply line | |
| 25 | Transport line | |
| 26 | Gas outlet | |
| 27 | Temperature-controlling device, cooling device $T_4$ | |
| 28 | Supply line | |
| 29 | Feed-in point | |
| 30 | Processing chamber | |
| 31 | Gas inlet element | |
| 32 | Heating device $T_5$ | |
| 33 | Gas outlet opening | |
| 34 | Supply line | |
| 35 | Susceptor | |
| 36 | Discharge line | |
| 37 | Cooling device $T_6$ | |
| 38 | Controlling device | |
| 39 | — | |
| 40 | — | |
| 41 | Mass flow controller | Line 1 |
| 42 | Mass flow controller | Line 2 |
| 43 | Mass flow controller | Line 1 |
| 44 | Mass flow controller | Line 2 |
| 45 | Mass flow controller | Line 3 |
| 46 | Mass flow controller | Line 4 |
| 47 | Mass flow controller | Line 5 |

$T_1$ Source temperature
$T_2$ Line temperature
$T_3$ Mixer temperature
$T_4$ Line temperature
$T_5$ Gas inlet temperature
$T_6$ Deposition temperature

What is claimed is:

1. A device for depositing one or more organic layers onto a substrate (20), the device comprising:
    a first process gas source (1) with a first evaporator (1'), wherein a first solid or liquid starting material is evaporated into a first gaseous starting material in the first evaporator (1'), wherein the first process gas source (1) is temperature-controlled to a first source temperature ($T_1$) by a first source temperature-controlling device (2);
    a first carrier gas supply line (4) fluidly connected to the first evaporator (1') and configured to feed a first carrier gas flow for transporting the first gaseous starting material out of the first evaporator (1') into a first transport line (5);
    the first transport line (5) that is temperature-controlled to a first line temperature ($T_2$) by means of a line temperature-controlling device (7);
    a first dilution gas supply line (8) fluidly connected to the first transport line (5) and configured to feed a first dilution gas flow into the first transport line (5), wherein the first dilution gas supply line (8) is located upstream from the first line temperature-controlling device (7);
    a processing chamber (30);
    a gas inlet element (31) disposed in the processing chamber (30) and configured to supply the first gaseous starting material into the processing chamber (30), wherein the gas inlet element (31) is temperature-controlled to a gas inlet temperature ($T_5$) by means of a gas inlet temperature-controlling device (32), wherein the gas inlet element (31) is fluidly connected to the first transport line (5);
    a second dilution gas supply line (34) fluidly connected to the gas inlet element (31) upstream from the gas inlet temperature-controlling device (32) and configured to feed a second dilution gas flow into the gas inlet element (31);
    a susceptor (35) that is temperature-controlled to a susceptor temperature ($T_6$) by means of a susceptor temperature-controlling device (37), wherein the substrate (20) is disposed on the susceptor (35), and wherein a layer is grown on the substrate (20) by means of the first gaseous starting material; and
    a controlling device (38) configured to control the first source temperature-controlling device (2) such that a temperature of the first source temperature-controlling device (2) is equal to the first source temperature ($T_1$), configured to control the first line temperature-controlling device (7) such that a temperature of the first line temperature-controlling device (7) is equal to the first line temperature ($T_2$), configured to control the gas inlet temperature-controlling device (32) such that a temperature of the gas inlet temperature-controlling device (32) is equal to the gas inlet temperature ($T_5$), and configured to control the susceptor temperature-controlling device (37) such that a temperature of the susceptor temperature-controlling device (37) is equal to the susceptor temperature ($T_6$),
    wherein the controlling device (38) is further configured to, while the layer is being deposited on the substrate (20), control the first source temperature ($T_1$) to be higher than the first line temperature ($T_2$), control the first line temperature ($T_2$) to be higher than the gas inlet temperature ($T_5$), and control the gas inlet temperature ($T_5$) to be higher than the susceptor temperature ($T_6$).

2. The device of claim 1, further comprising:
    a second process gas source (11) with a second evaporator (11'), wherein a second solid or liquid starting material is evaporated into a second gaseous starting material in the second evaporator (11'), and wherein the second process gas source (11) is temperature controlled to a second source temperature ($T_1'$) by a second temperature-controlling device (12);
    a second carrier gas supply line (14) fluidly connected to the second evaporator (11') and configured to feed a second carrier gas flow for transporting the second gaseous starting material out of the second evaporator (11') into a second transport line (15), wherein the second transport line (15) is temperature-controlled to a second line temperature ($T_2'$) by means of a second line temperature-controlling device (17);
    a third dilution gas supply line (18) fluidly connected to the second transport line (15), through which a third dilution gas flow is fed into the second transport line (15) wherein the first transport line (5) and second transport line (15) are fluidly connected to a mixing device (21), which is temperature-controlled to a mixer temperature ($T_3$) by means of a mixer temperature-controlling device (22); and,
    a fourth dilution gas supply line (24) fluidly connected to the mixing device (21) upstream from the mixer temperature-controlling device (22), and configured to feed a fourth dilution gas flow into the mixing device (21).

3. The device of claim 2, wherein the mixer temperature ($T_3$) is lower than both the first and second line temperatures ($T_2$, $T_2'$), and higher than the gas inlet temperature ($T_5$).

4. The device of claim 2, further comprising:
    a third transport line (25) located downstream from the mixing device (21) and upstream from the gas inlet element (31), wherein the third transport line (25) is configured to transport the first and second gaseous starting materials from the mixing device (21) into the gas inlet element (31), wherein the third transport line (25) is temperature-controlled to a third line temperature ($T_4$) by a third line temperature-controlling device (27; and
    a fifth dilution gas supply line (28) fluidly connected to the third transport line (25) upstream from the third line temperature-controlling device (27) and configured to feed a fifth dilution gas flow into the third transport line (25).

5. The device of claim 4, wherein the mixer temperature ($T_3$) is higher than the third line temperature ($T_4$), and the third line temperature ($T_4$) is higher than the gas inlet temperature ($T_5$).

6. A method for depositing one or more organic layers onto at least one substrate (20), the method comprising:
    evaporating, in a first evaporator (1') of a first process gas source (1), a first solid or liquid starting material into a first gaseous starting material, wherein the first process gas source (1) is temperature-controlled to a first source temperature ($T_1$) by a first source temperature-controlling device (2);
    feeding, by a first carrier gas supply line (4), a first carrier gas into the first evaporator (1'), wherein the first carrier gas transports the first gaseous starting material out of the first evaporator (1') into a first transport line (5), wherein the first transport line (5) is temperature-controlled to a first line temperature ($T_2$) by means of a first line temperature-controlling device (7);
    feeding, by a first dilution gas supply line (8), a first dilution gas flow into the first transport line (5), wherein the first dilution gas supply line (8) is located upstream from the first line temperature-controlling device (7);

supplying, by a gas inlet element (31), the first gaseous starting material into a process chamber (30), wherein the gas inlet element (31) is temperature-controlled to a gas inlet temperature ($T_5$) by means of a gas inlet temperature-controlling device (32), and is fluidly connected to the first transport line (5);

feeding, by a second dilution gas supply line (34), a second dilution gas flow into the gas inlet element (31) upstream from the gas inlet temperature-controlling device (32); and depositing a layer on the at least one substrate (20) lying on a susceptor (35) by means of the gaseous starting material, wherein the susceptor is disposed in the process chamber (30) and is temperature-controlled to a susceptor temperature ($T_6$) by means of a susceptor temperature-controlling device (37), wherein, while depositing the layer, the first source temperature ($T_1$) is higher than the first line temperature ($T_2$) the first line temperature ($T_2$) is higher than the gas inlet temperature ($T_5$), and the gas inlet temperature ($T_5$) is higher than the susceptor temperature ($T_6$).

7. The method of claim 6, further comprising:

evaporating, in a second evaporator (11') of a second process gas source (11), a second a solid or liquid starting material into a second gaseous starting material, wherein the second process gas source (11) is temperature-controlled to a second source temperature ($T_1'$) by means of a second source temperature-controlling device (12);

feeding, by a second carrier gas supply line (14), the second carrier gas into the second evaporator (11'), wherein the second carrier gas transports the second gaseous starting material out of the second evaporator (11') into a second transport line (15), wherein the second transport line (15) is temperature-controlled to a second line temperature ($T_2'$) by means of a second line temperature-controlling device (17);

feeding, by a third dilution gas supply line (18), a third dilution gas flow into the second transport line (15), wherein the first transport line (5) and second transport line (15) are fluidly connected to a mixing device (21), which is temperature-controlled to a mixer temperature ($T_3$) by means of a mixer temperature-controlling device (22); and, feeding, by a fourth dilution gas supply line (24), a fourth dilution gas flow into the mixing device (21) upstream from the mixer temperature-controlling device (22).

8. The method of claim 7, wherein the mixer temperature ($T_3$) is lower than both the first and second line temperatures ($T_2$, $T_2'$), and higher than the gas inlet temperature ($T_5$).

9. The method of claim 7, further comprising:

transporting, by a third transport line (25), the first and second gaseous starting materials from the mixing device (21) to the gas inlet element (31), wherein the third transport line (25) is temperature-controlled to a third line temperature ($T_4$) by a third line temperature-controlling device (27); and feeding, by a fifth dilution gas supply line (28), a fifth dilution gas flow into the third transport line (25) upstream from the third line temperature-controlling device (27).

10. The method of claim 9, wherein the mixer temperature ($T_3$) is higher than the third line temperature ($T_4$), and the third line temperature ($T_4$) is higher than the gas inlet temperature ($T_5$).

11. The method of claim 6, wherein a partial pressure of the first gaseous starting material in the first carrier gas is incrementally diminished between the first evaporator (1') and the gas inlet element (31) at different points spaced apart from each other in a direction of flow of the first gaseous starting material, wherein the temperature in the flow of the first gaseous starting material at each point between the first evaporator (1') and the gas inlet element (31) is higher than a condensation temperature of the gaseous starting material.

* * * * *